United States Patent
Kim et al.

(10) Patent No.: US 12,010,893 B2
(45) Date of Patent: Jun. 11, 2024

(54) COLOR CONVERSION PANEL AND DISPLAY DEVICE INCLUDING THE SAME

(71) Applicant: Samsung Display Co., Ltd., Yongin-si (KR)

(72) Inventors: Hoon Kim, Suwon-si (KR); Donghwan Kim, Hwaseong-si (KR); Jang-Bog Ju, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 325 days.

(21) Appl. No.: 17/356,250

(22) Filed: Jun. 23, 2021

(65) Prior Publication Data

US 2022/0037414 A1 Feb. 3, 2022

(30) Foreign Application Priority Data

Aug. 3, 2020 (KR) ........................ 10-2020-0096769

(51) Int. Cl.
*H10K 59/38* (2023.01)
*H10K 50/858* (2023.01)

(52) U.S. Cl.
CPC ........... *H10K 59/38* (2023.02); *H10K 50/858* (2023.02)

(58) Field of Classification Search
CPC .. H01K 59/38; H01K 59/8731; H01K 59/879; H01K 59/8792; H01K 50/844; H01K 50/858; G02F 1/133614; G02F 1/133526; G02F 1/133345; B32B 2307/418; G02B 5/22; G02B 5/223; G02B 5/003
See application file for complete search history.

(56) References Cited

U.S. PATENT DOCUMENTS

2012/0156436 A1* 6/2012 Kim ................... G02B 6/005
428/172
2017/0307932 A1* 10/2017 Lee ................... G02F 1/133553

FOREIGN PATENT DOCUMENTS

| JP | 2015-043256 | 3/2015 |
|---|---|---|
| KR | 10-2015-0019325 A | 2/2015 |
| KR | 10-1809259 B1 | 12/2017 |

* cited by examiner

*Primary Examiner* — Angela K Davison
(74) *Attorney, Agent, or Firm* — Lewis Roca Rothgerber Christie LLP

(57) ABSTRACT

A color conversion panel includes a base substrate, a low refractive index layer under the base substrate, a plurality of light blocking members spaced apart from each other in the low refractive index layer and extending in a first direction normal to a surface of the base substrate, a high refractive index layer under the low refractive index layer and including at least one convex portion that protrudes toward the base substrate, a color filter layer under the high refractive index layer, and a color conversion layer under the color filter layer and to convert an incident light into a transmitted light that has a second color different from a first color of the incident light.

20 Claims, 10 Drawing Sheets

COLOR CONVERSION PANEL AND DISPLAY DEVICE INCLUDING THE SAME

CROSS-REFERENCE TO RELATED APPLICATION

This application claims priority to and the benefit of Korean Patent Application No. 10-2020-0096769, filed on Aug. 3, 2020, the entire content of which is hereby incorporated by reference.

BACKGROUND

Field

Embodiments of the present disclosure relate to a color conversion panel. More particularly, embodiments of the present disclosure relate to a color conversion panel and a display device including the color conversion panel.

Discussion of the Background

Recently, a display device having light weight and small size has been manufactured. A cathode ray tube (CRT) display device has been utilized due to its performance and competitive price. However the CRT display device has a weakness of a large size and/or a lack of portability. Therefore a display device such as a plasma display device, a liquid crystal display device and an organic light emitting display device has been highly regarded due to a small size, a light weight and a low-power-consumption.

The display device may include a color conversion panel. The color conversion panel may include a color conversion layer having quantum dots to convert the color of light. A desired color may be given to an image that is displayed on the display device by the color conversion panel, and the color conversion panel may improve a display quality of the display device by improving color reproducibility of the image.

An external light that is incident from an outside of the display device into an inside of the color conversion layer may be emitted to the outside again. In this case, the display quality of the display device may be reduced.

The above information disclosed in this Background section is only for providing an understanding of the background of the present disclosure, and, therefore, it may contain information that does not constitute prior art.

SUMMARY

One or more aspects of example embodiments of the present disclosure are directed towards a color conversion panel that is to reduce an amount of an external light incident into a color conversion layer.

One or more aspects of example embodiments of the present disclosure are directed towards a display device including a color conversion panel that is to reduce an amount of an external light incident into a color conversion layer.

Additional aspects and/or features of the present disclosure will be set forth in the description which follows, and in part will be apparent from the description, or may be learned by practice of the present disclosure.

A color conversion panel according to an embodiment may include a base substrate, a low refractive index layer under the base substrate, a plurality of light blocking members spaced apart from each other in the low refractive index layer and extending in a first direction normal (e.g., perpendicular) to a surface of the base substrate, a high refractive index layer under the low refractive index layer and including at least one convex portion that protrudes toward the base substrate, a color filter layer under the high refractive index layer, and a color conversion layer under the color filter layer and to convert an incident light into a transmitted light that has a second color different from a first color of the incident light. Each of the plurality of light blocking members may be to absorb at least a portion of an external light incident from an outside into the low refractive index layer through the base substrate at a side surface of the light blocking member.

According to an embodiment, the plurality of light blocking members may be spaced apart in a second direction perpendicular to the first direction.

According to an embodiment, a separation distance between adjacent light blocking members of the plurality of light blocking members may be greater than a length of each of the adjacent light blocking members in the first direction.

According to an embodiment, each of the plurality of light blocking members may have a black color.

According to an embodiment, the color conversion layer may overlap at least one of the plurality of light blocking members.

According to an embodiment, a refractive index of the low refractive index layer may be smaller than each of a refractive index of the base substrate and a refractive index of the high refractive index layer.

According to an embodiment, the refractive index of the high refractive index layer may be the same as a refractive index of the color filter layer.

A display device according to an embodiment may include a display panel including an array of pixels and a color conversion panel on the display panel. The color conversion panel may include a base substrate, a low refractive index layer under the base substrate, a plurality of light blocking members spaced apart from each other in the low refractive index layer and extending in a first direction normal (e.g., perpendicular) to a surface of the base substrate, a high refractive index layer under the low refractive index layer and including at least one convex portion that protrudes toward the base substrate, a color filter layer under the high refractive index layer, and a color conversion layer under the color filter layer and to convert an incident light incident from the display panel into a transmitted light that has a second color different from a first color of the incident light. Each of the plurality of light blocking members may be to absorb at least a portion of an external light incident from an outside into the low refractive index layer through the base substrate at a side surface of the light blocking member.

According to an embodiment, a separation distance between adjacent light blocking members of the plurality of the light blocking members may be greater than a length of each of the adjacent light blocking members in the first direction.

According to an embodiment, each of the plurality of the light blocking members may have a black color.

According to an embodiment, the color conversion layer may overlap at least one of the plurality of the light blocking members.

According to an embodiment, a refractive index of the low refractive index layer may be smaller than each of a refractive index of the base substrate and a refractive index of the high refractive index layer.

According to an embodiment, a refractive index of the high refractive index layer may be the same as a refractive index of the color filter layer.

A display device according to an embodiment may include a display panel including an array of pixels, a color conversion panel on the display panel and a film structure on the color conversion panel. The color conversion panel may include a first base substrate, a color filter layer under the first base substrate, and a color conversion layer under the color filter layer and to convert an incident light incident from the display panel into a transmitted light that has a second color different from a first color of the incident light. The film structure may include a second base substrate, a low refractive index layer under the second base substrate, a plurality of light blocking members spaced apart from each other in the low refractive index layer and extending in a first direction normal (e.g., perpendicular) to a surface of the second base substrate, and a high refractive index layer under the low refractive index layer and including at least one convex portion that protrudes toward the second base substrate. Each of the plurality of light blocking members may be to absorb at least a portion of an external light incident from an outside into the low refractive index layer through the second base substrate at a side surface of the light blocking member.

According to an embodiment, the plurality of light blocking members may be spaced apart in a second direction perpendicular to the first direction.

According to an embodiment, a separation distance between adjacent light blocking members of the plurality of the light blocking members may be greater than a length of each of the adjacent light blocking members in the first direction.

According to an embodiment, each of the plurality of the light blocking members may have a black color.

According to an embodiment, the color conversion layer may overlap at least one of the plurality of the light blocking members.

According to an embodiment, a refractive index of the low refractive index layer may be smaller than each of a refractive index of the second base substrate and a refractive index of the high refractive index layer.

The display device according to example embodiments includes the base substrate, the low refractive index layer under the base substrate, the plurality of light blocking members in the low refractive index layer and extending in a direction normal (e.g., perpendicular) to the surface of the base substrate, and the color conversion layer under the light blocking members. External light incident from the outside into the low refractive index layer through the base substrate may be absorbed by the side surface of each of the plurality of the light blocking members. Accordingly, the display device may reduce the external light that is incident into the color conversion layer. Thus, a display quality of the display device may be improved.

It is to be understood that both the foregoing general description and the following detailed description describe embodiments, are explanatory, and are intended to provide further explanation of the present disclosure as defined by the claims and equivalents thereof.

BRIEF DESCRIPTION OF THE DRAWINGS

The accompanying drawings, which are included to provide a further understanding of the present disclosure and are incorporated in and constitute a part of this specification, illustrate example embodiments of the present disclosure, and together with the description serve to explain the present disclosure.

DETAILED DESCRIPTION

As used herein, the use of the term "may," when describing embodiments of the present disclosure, refers to "one or more embodiments of the present disclosure." As used herein, the term "and/or" includes any and all combinations of one or more of the associated listed items. As used herein, the terms "substantially," "about," "approximately," and similar terms are used as terms of approximation and not as terms of degree, and are intended to account for the inherent deviations in measured or calculated values that would be recognized by those of ordinary skill in the art.

It will be understood that when an element or layer is referred to as being "on", "connected to", "coupled to", or "adjacent to" another element or layer, it can be directly on, connected to, coupled to, or adjacent to the other element or layer, or one or more intervening elements or layers may be present. In contrast, when an element or layer is referred to as being "directly on," "directly connected to", "directly coupled to", or "immediately adjacent to" another element or layer, there are no intervening elements or layers present.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Illustrative, non-limiting example embodiments will be more clearly understood from the following detailed description in conjunction with the accompanying drawings.

Figure 1:
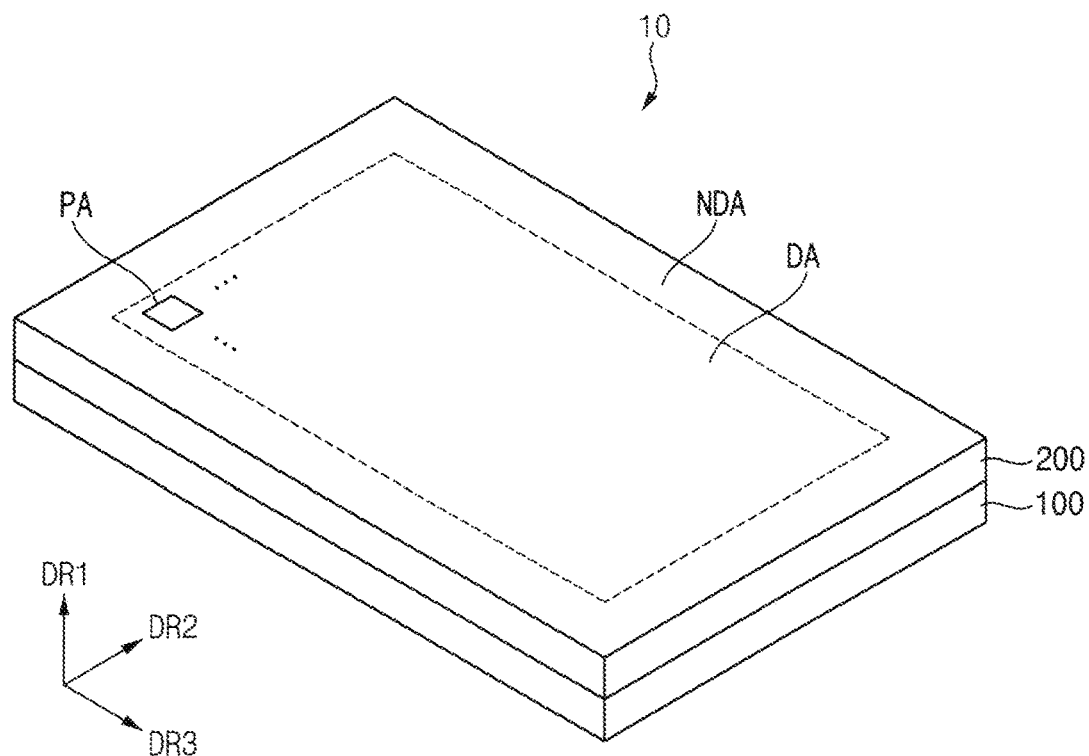
FIG. 1 is a perspective view illustrating a display device according to an embodiment.
Figure 2:
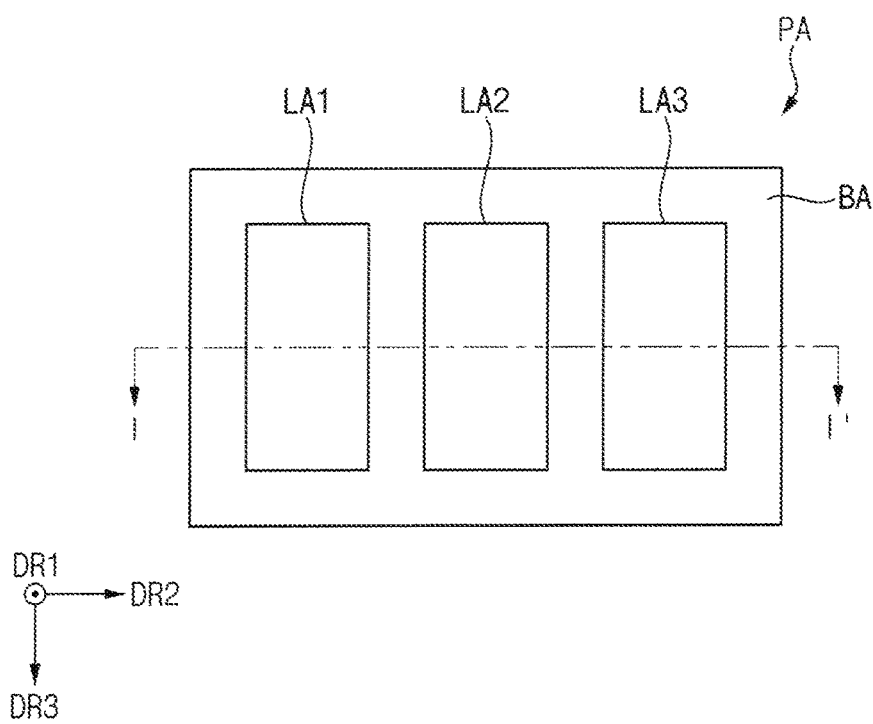
FIG. 2 is a plan view illustrating a pixel area included in the display device of FIG. 1.
Figure 3:
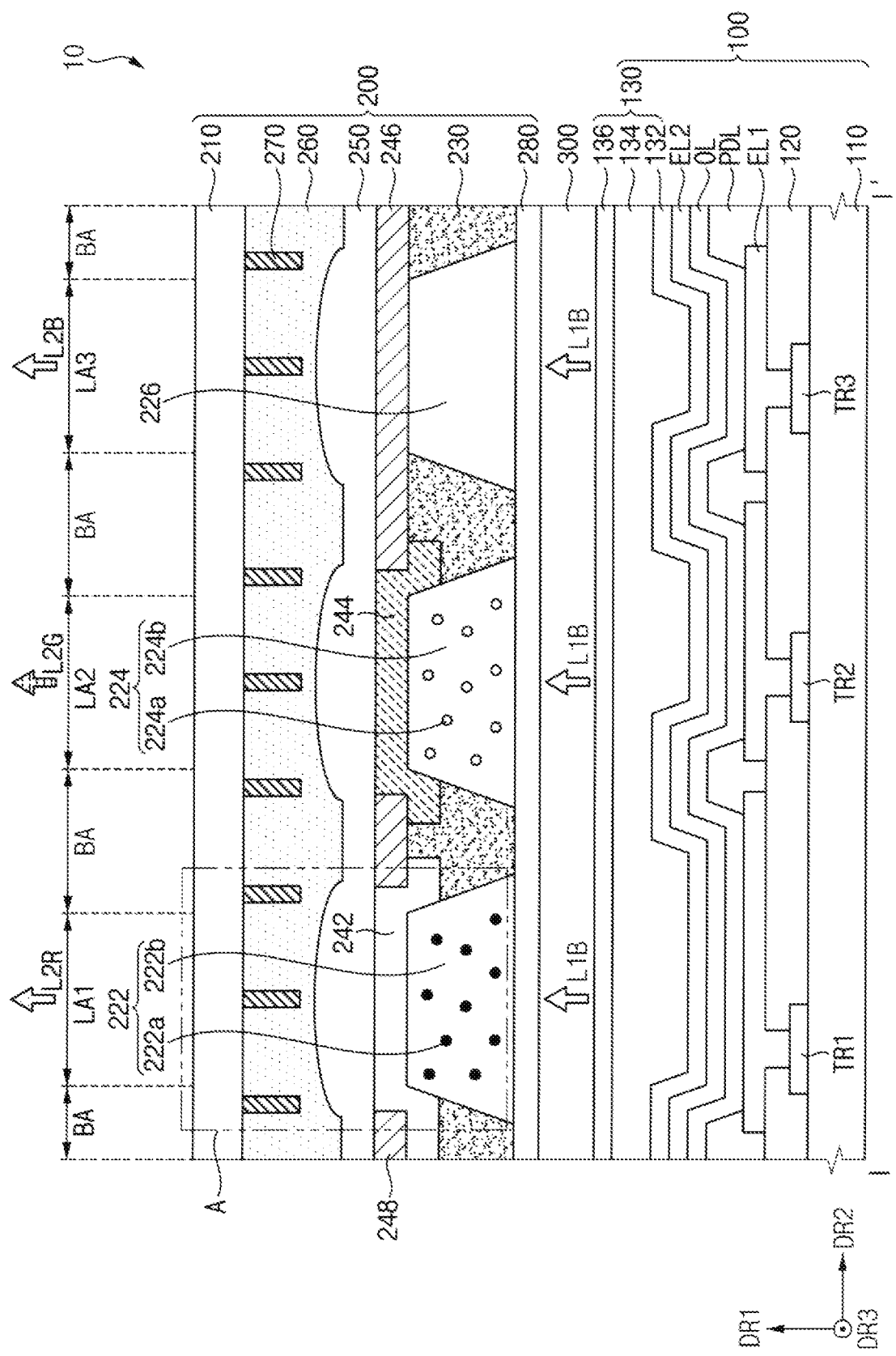
FIG. 3 is a cross-sectional view taken along line I-I' of FIG. 2.

FIG. 1 is a perspective view illustrating a display device according to an embodiment. FIG. 2 is a plan view illustrating a pixel area included in the display device of FIG. 1.
FIG. 3 is a cross-sectional view taken along line I-I' of FIG. 2.

Referring to FIGS. 1, 2, and 3, a display device 10 according to an embodiment may include a display panel 100 and a color conversion panel 200. The display panel 100 may include an array of pixels. Each pixel of the array of pixels may include a light emitting element to generate a light in response to a driving signal.

The color conversion panel 200 may include a color conversion layer to convert a wavelength of the light generated by the light emitting element. In addition, the color conversion panel 200 may include a color filter layer to transmit a light having a set or specific color (e.g., a light having a wavelength in a set or specific wavelength range).

The display device 10 may include a display area DA and a non-display area NDA. An image may be displayed in the display area DA. The non-display area NDA may be around (e.g., surround) the display area DA. The display area DA may include a plurality of pixel areas PA.

Each of the plurality of pixel areas PA may include a light emitting area and a light blocking area BA. The light generated by the light emitting element may be emitted to an outside through the light emitting area. The light blocking area BA may be around (e.g., surround) the light emitting area. The light emitting area may include a first light emitting area LA1, a second light emitting area LA2, and a third light emitting area LA3. Transmitted lights having different colors may be emitted from the first to third light emitting areas LA1, LA2, and LA3, respectively.

When an incident light L1B emitted from the display panel 100 is incident into the color conversion panel 200, transmitted lights L2R, L2G, and L2B having different colors may be emitted from the first to third light emitting areas LA1, LA2, and LA3, respectively. For example, the incident light L1B may be blue light. The first transmitted light L2R emitted from the first light emitting area LA1 may be red light. The second transmitted light L2G emitted from the second light emitting area LA2 may be green light. The third transmitted light L2B emitted from the third light emitting area LA3 may be blue light.

The display panel 100 may include driving elements TR1, TR2, and TR3 disposed on a first base substrate 110. The driving elements TR1, TR2, and TR3 may be electrically coupled (e.g., connected) to the light emitting element (e.g., to respective light emitting elements). In some embodiments, each of the driving elements TR1, TR2, and TR3 may include a thin film transistor. In some embodiments, the thin film transistor of each of the driving elements TR1, TR2, and TR3 may be electrically coupled (e.g., connected) to a respective light emitting element.

For example, a channel layer of the thin film transistor may include (e.g., be) amorphous silicon, polycrystalline silicon, and/or a metal oxide semiconductor. For example, the metal oxide semiconductor may include (e.g., be) a two-component compound ABx ($AB_x$), a ternary (three-component) compound ABxCy ($AB_xC_y$), and/or a four-component compound ABxCyDz ($AB_xC_yD_z$), which contain indium (In), zinc (Zn), gallium (Ga), tin (Sn), titanium (Ti), aluminum (Al), hafnium (Hf), zirconium (Zr), magnesium (Mg), and/or the like. For example, the metal oxide semiconductor may include (e.g., be) zinc oxide ZnOx ($ZnO_x$), gallium oxide GaOx ($GaO_x$), titanium oxide TiOx ($TiO_x$), tin oxide SnOx ($SnO_x$), indium oxide InOx ($InO_x$), indium-gallium oxide (IGO), indium-zinc oxide (IZO), indium tin oxide (ITO), gallium zinc oxide (GZO), zinc magnesium oxide (ZMO), zinc tin oxide (ZTO), zinc zirconium oxide ZnZrxOy ($ZnZr_xO_y$), indium-gallium-zinc oxide (IGZO), indium-zinc-tin oxide (IZTO), indium-gallium-hafnium oxide (IGHO), tin-aluminum-zinc oxide (TAZO), indium-gallium-tin oxide (IGTO), and/or the like.

Each of the driving elements TR1, TR2, and TR3 may be covered by an insulation structure 120. The insulation structure 120 may include a combination of an inorganic insulation layer and an organic insulation layer. The insulation structure 120 may have openings (e.g., contact holes) exposing the driving elements TR1, TR2, and TR3, through which the light emitting elements may be electrically coupled (e.g., connected) to respective driving elements TR1, TR2, and TR3.

For example, the light emitting element may be an organic light emitting diode ("OLED"). For another example, the light emitting element may be a nano light emitting diode. However, the present disclosure is not limited thereto.

In some embodiments, the organic light emitting diode may include a first electrode EL1, a second electrode EL2, and an emission layer OL. The emission layer OL may be disposed between the first electrode EL1 and the second electrode EL2.

The first electrode EL1 may function as an anode. For example, the first electrode EL1 may be formed as a transmitting electrode or a reflecting electrode according to an emission type (e.g., emission kind) of the display device 10. When the first electrode EL1 is the reflecting electrode, the first electrode EL1 may include (e.g., be) gold (Au), silver (Ag), aluminum (Al), copper (Cu), nickel (Ni), platinum (Pt), magnesium (Mg), chromium (Cr), tungsten (W), molybdenum (Mo), titanium (Ti) or a combination thereof. In some embodiments, the first electrode EL1 may include (e.g., be) or may further include (e.g., further be) a metal oxide layer including (e.g., being) indium tin oxide, indium zinc oxide, and/or the like.

A pixel defining layer PDL may be disposed on the insulation structure 120. The pixel defining layer PDL may have an opening exposing at least a portion of the first electrode EL1. For example, the pixel defining layer PDL may cover a part (e.g., an edge) of the first electrode EL1 and may have an opening exposing another part (e.g., a center part) of the first electrode EL1. For example, the pixel-defining layer PDL may include (e.g., be) an organic insulating material. At least a portion of the emission layer OL may be disposed in the opening of the pixel defining layer PDL. In an embodiment, the emission layer OL may extend continuously over a plurality of pixels in the display area DA. For example, the emission layer OL may be a common layer. In another example embodiment, the emission layer OL may be separated from an emission layer of an adjacent pixel. For example, in some embodiments, the emission layer OL may be provided in plurality such that each of the plurality of emission layers OL corresponds to a respective pixel.

The emission layer OL may include one or more functional layers such as a hole injection layer, a hole transporting layer, an organic light emitting layer, an electron transporting layer, and/or an electron injection layer. In some embodiments, the organic light emitting layer may include (e.g., be) a low molecular weight organic compound and/or a high molecular weight organic compound.

In an embodiment, the emission layer OL may generate a blue light. However, example embodiments are not limited thereto. For example, the emission layer OL may generate a red light, a green light, and/or the like. In another example embodiment, the emission layer OL may generate lights having different colors in different pixels.

The second electrode EL2 may be formed as a transmitting electrode or a reflecting electrode according to the emission type (e.g., emission kind) of the display device 10. For example, the second electrode EL2 may include (e.g., be) a metal, a metal alloy, a metal nitride, a metal fluoride, a conductive metal oxide, or a combination thereof. In some embodiments, the second electrode EL2 may extend continuously over a plurality of pixels in the display area DA. For example, the second electrode EL2 may be a common electrode.

In some embodiments, when the light emitting element includes (e.g., is) a nano light emitting diode, the nano light emitting diode may include the first electrode EL1, the second electrode EL2, semiconductor layers, and an active material layer disposed between the semiconductor layers. The nano light emitting diode may emit light having a certain wavelength range according to a material included in (e.g., constituting) the active material layer.

The display panel 100 may further include an encapsulation layer 130 covering the array of pixels. The encapsulation layer 130 may extend continuously to cover the display area DA (e.g., the entire display area DA).

For example, the encapsulation layer 130 may include a stacked structure of an organic thin film and an inorganic thin film. For example, as shown in FIG. 3, the encapsulation layer 130 may include a first inorganic thin film 132, an organic thin film 134 disposed on the first inorganic thin film 132, and a second inorganic thin film 136 disposed on the organic thin film 134. However, example embodiments are not limited thereto. For example, the encapsulation layer 130 may have a structure including at least two organic thin films and at least three inorganic thin films.

In some embodiments, the organic thin film 134 may include (e.g., be) a cured resin such as polyacrylate, epoxy resin and/or the like. For example, the cured resin may be formed from cross-linking reaction of monomers. In some embodiments, each of the first and second inorganic thin films 132 and 136 may include (e.g., be) an inorganic material such as silicon oxide, silicon nitride, silicon carbide, aluminum oxide, tantalum oxide, hafnium oxide, zirconium oxide, titanium oxide, and/or the like.

A filling member 300 may be disposed between the display panel 100 and the color conversion panel 200. The filling member 300 may include (e.g., be) an organic material such as a silicone resin, an epoxy resin, and/or the like.

The color conversion panel 200 may include a second base substrate 210, the color conversion layer, a partition wall 230, the color filter layer, a high refractive index layer 250, a low refractive index layer 260, and a plurality of light blocking members 270. In some embodiments, the color conversion panel 200 may further include a transmission layer 226.

The color conversion layer may convert the incident light L1B into a transmitted light having a color different from a color of the incident light L1B. The color conversion layer may overlap the light emitting area. For example, the color conversion layer may include a first color conversion layer 222 overlapping the first light emitting area LA1 and a second color conversion layer 224 overlapping the second light emitting area LA2.

The first color conversion layer 222 may include wavelength-converting particles 222a and a resin part 222b. For example, each of the wavelength-converting particles 222a may include a quantum dot. The quantum dot may be defined as a nano-crystalline semiconductor material. The quantum dot may absorb an incident light and emit a light having a wavelength different from a wavelength of the incident light. In some embodiments, the quantum dot may have a diameter equal to or less than about 100 nm. In an embodiment, the quantum dot may have a diameter (e.g., an average particle size) of about 1 nm to about 20 nm.

The quantum dots may be disposed in the resin part 222b. In some embodiments, the resin part 222b may include (e.g., be) an epoxy resin, an acrylic resin, a phenolic resin, a melamine resin, a cardo resin, an imide resin, and/or the like.

The first color conversion layer 222 may convert the incident light L1B (e.g., blue incident light) into the first transmitted light L2R, which may have a wavelength greater than a wavelength of the incident light L1B, and may emit the first transmitted light L2R. For example, the first color conversion layer 222 may include quantum dots that are to absorb blue light and emit red light.

The second color conversion layer 224 may include wavelength-converting particles 224a and a resin part 224b. The second color conversion layer 224 may convert the incident light L1B (e.g., blue incident light) into the second transmitted light L2G, which may have a wavelength greater than the wavelength of the incident light L1B, and may emit the second transmitted light L2G. For example, the second color conversion layer 224 may include quantum dots that are to absorb blue light and emit green light.

Each of the quantum dots included in the first and second color conversion layers 222 and 224 may include (e.g., be) one or more selected from nanocrystalline materials, a silicon-based nanocrystal, a group II-VI-based compound semiconductor nanocrystal, a group III-V-based compound semiconductor nanocrystal, a group IV-VI-based compound semiconductor nanocrystal, and a mixture thereof. The group II-VI-based compound semiconductor nanocrystal may include (e.g., be) at least one selected from CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, and HgZnSTe. The group III-V-based compound semiconductor nanocrystal may include (e.g., be) at least one selected from GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs. The group IV-VI-based compound semiconductor nanocrystal may include (e.g., be) SbTe.

Even if the quantum dots included in the first and second color conversion layers 222 and 224 include (e.g., are) the same material, light emitted from the first and second color conversion layers 222 and 224 may have different wavelengths from each other according to sizes of the quantum dots of the first and second color conversion layers 222 and 224. For example, the smaller a size (e.g., breadth and/or diameter) of a quantum dot, the shorter the wavelength of light emitted from the quantum dot may be. Accordingly, light of different visible colors may be emitted by adjusting sizes of the quantum dots of the first and second color conversion layers 222 and 224.

For example, when the first and second transmitted lights L2R and L2G emitted from the first and second color conversion layers 222 and 224, respectively, are red and green lights, respectively, the materials of the quantum dots of the first and second color conversion layers 222 and 224 may be the same, but the size of the quantum dot of the first color conversion layer 222 may be greater than the size of the quantum dot of the second color conversion layer 224.

In an embodiment, each of the first and second color conversion layers 222 and 224 may further include scattering particles. The scattering particles may scatter the incident light L1B without substantially changing the wavelength of the incident light L1B. Therefore, a path of a light progressing in (e.g., progressing through) the first and second color conversion layers 222 and 224 may be increased.

The transmission layer 226 may overlap the third light emitting area LA3. The transmission layer 226 may not convert the incident light L1B, and may emit third transmitted light L2B substantially the same as (e.g., substantially the same wavelength as) the incident light L1B. For example, the transmission layer 226 may absorb a blue light and emit the blue light. The transmission layer 226 may include a resin part. For example, the resin part may include (e.g., be) the same material as the resin parts 222b and 224b of the first and second color conversion layers 222 and 224. In some embodiments, the transmission layer 226 may further include the scattering particles.

The partition wall 230 may be around (e.g., surround) side surfaces of the first color conversion layer 222, the second color conversion layer 224, and the transmission layer 226. In some embodiments, the partition wall 230 may have openings corresponding to the first color conversion layer 222, the second color conversion layer 224, and the transmission layer 226, and each of the first color conversion layer 222, the second color conversion layer 224, and the transmission layer 226 may be in a corresponding opening of the partition wall 230. The partition wall 230 may form a space (e.g., openings) to receive an ink composition for forming the first color conversion layer 222, the second color conversion layer 224, and the transmission layer 226. Accordingly, the partition wall 230 may have a grid shape or a matrix shape, in a plan view.

In some embodiments, the partition wall 230 may include (e.g., be) an organic material such as an epoxy resin, a phenolic resin, an acrylic resin, a silicone resin, and/or the like.

In an embodiment, the partition wall 230 may include (e.g., be) a light blocking material. For example, at least a portion of the partition wall 230 may include (e.g., be) the light blocking material such as a pigment, a dye, a carbon black, and/or the like. In some embodiments, the partition wall 230 may entirely overlap the light blocking area BA.

The partition wall 230 may have a single-layered structure or a multi-layered structure. In some embodiments, the partition wall 230 may be formed to have (e.g., may have) a predetermined or set thickness to suitably function to receive an ink composition. Thus, in some embodiments, the partition wall 230 may have a multi-layered structure.

In an embodiment, the color conversion panel 200 may further include a protective layer 280. The protective layer 280 may cover (e.g., may cover a lower surface of) the first and second color conversion layers 222 and 224, the transmission layer 226, and the partition wall 230. In some embodiments, the protective layer 280 may include (e.g., be) an inorganic material. In another example embodiment, the protective layer 280 may be omitted.

The color filter layer may be disposed between the second base substrate 210 and the color conversion layer. The color filter layer may transmit a light having a set color.

In an embodiment, the color filter layer may include a first color filter layer 242, a second color filter layer 244, and a third color filter layer 246. The first to third color filter layers 242, 244, and 246 may overlap the first to third light emitting areas LA1, LA2, and LA3, respectively. Accordingly, the colors of the transmitted lights L2R, L2G, and L2B emitted from the first to third light emitting areas LA1, LA2, and LA3, respectively, may be determined by the first to third color filter layers 242, 244, and 246, respectively.

The first color filter layer 242 may be disposed between the second base substrate 210 and the first color conversion layer 222. For example, the first color filter layer 242 may overlap the first light emitting area LA1. For example, the first color filter layer 242 may transmit a red light that is converted by the first color conversion layer 222 and may block a blue light that is not converted by the first color conversion layer 222.

The second color filter layer 244 may be disposed between the second base substrate 210 and the second color conversion layer 224. For example, the second color filter layer 244 may overlap the second light emitting area LA2. For example, the second color filter layer 244 may transmit a green light that is converted by the second color conversion layer 224 and may block a blue light that is not converted by the second color conversion layer 224.

The third color filter layer 246 may be disposed between the second base substrate 210 and the transmission layer 226. For example, the third color filter layer 246 may overlap the third light emitting area LA3. For example, the third color filter layer 246 may transmit a blue light that is transmitted by the transmission layer 226.

In an embodiment, the color filter layer may further include a light blocking layer 248 overlapping the light blocking area BA. The light blocking layer 248 may be formed in a same layer as the third color filter layer 246 and may be continuously coupled (e.g., connected) to the third color filter layer 246. In some embodiments, the light blocking layer 248 may include (e.g., be) the same material as the third color filter layer 246. In an embodiment, the light blocking layer 248 may be formed entirely in the light blocking area BA. The light blocking layer 248 may prevent or reduce color mixing of the light emitting areas adjacent to each other.

Figure 4:
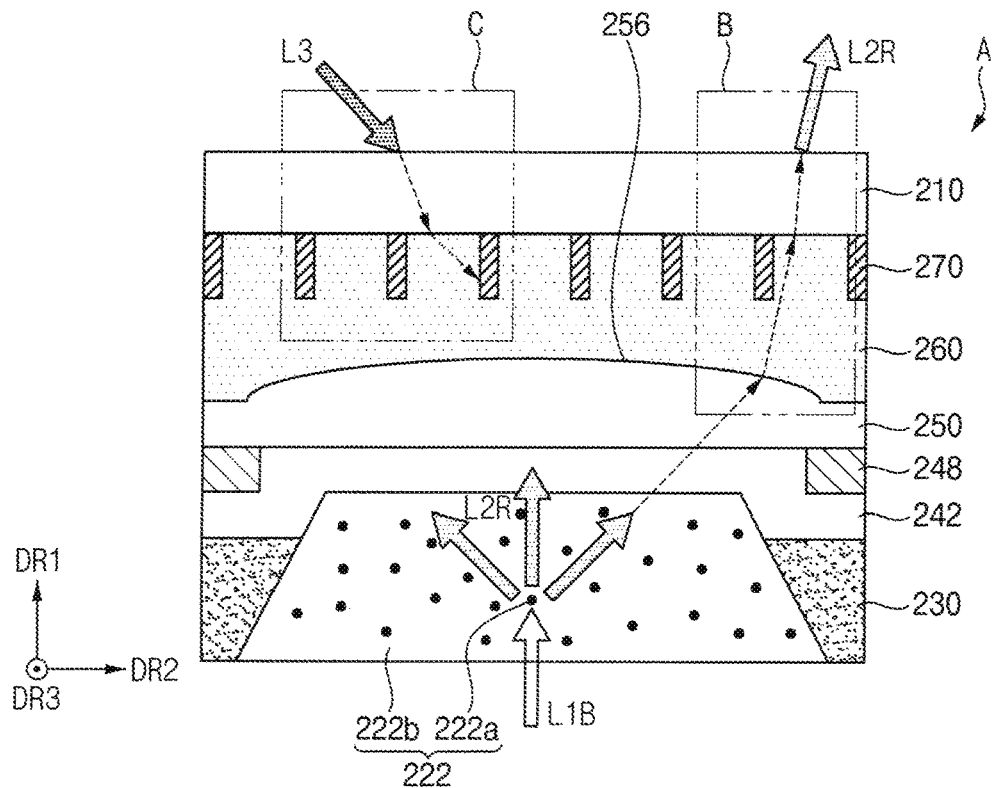
FIG. 4 is an enlarged view illustrating an example of area A of FIG. 3.
Figure 5:
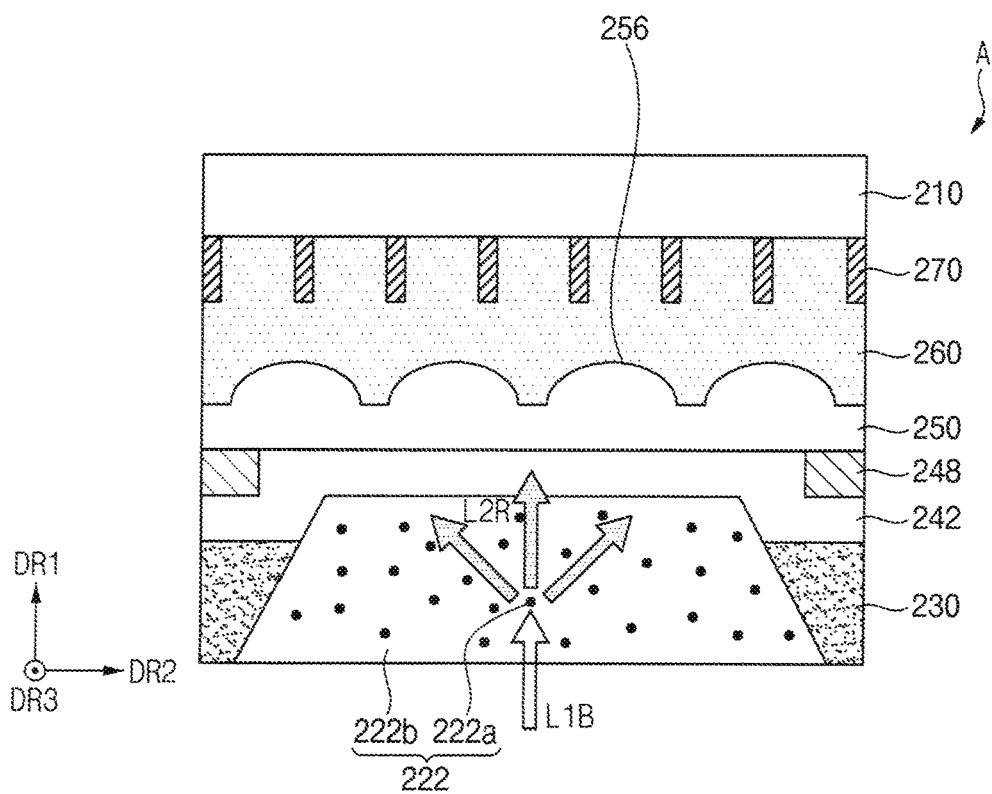
FIG. 5 is an enlarged view illustrating another example of area A of FIG. 3.
Figure 6:
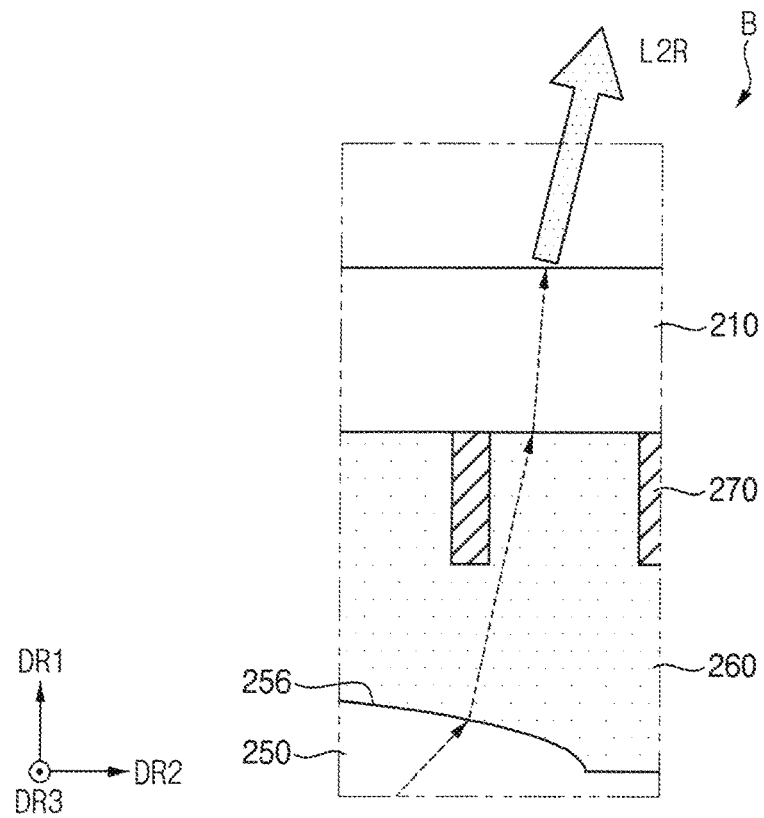
FIG. 6 is an enlarged view illustrating an area B of FIG. 4.
Figure 7:
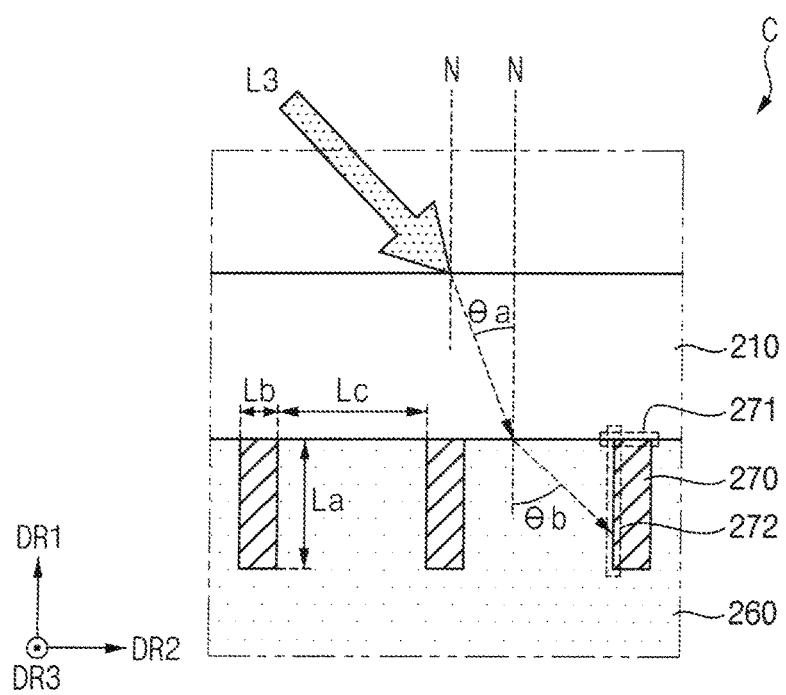
FIG. 7 is an enlarged view illustrating an area C of FIG. 4.

FIG. 4 is an enlarged view illustrating an example of area A of FIG. 3. FIG. 5 is an enlarged view illustrating another example of area A of FIG. 3. FIG. 6 is an enlarged view illustrating an area B of FIG. 4. FIG. 7 is an enlarged view illustrating an area C of FIG. 4.

Referring to FIGS. 3 to 7, the high refractive index layer 250 may be disposed on the color filter layer. In some embodiments, the high refractive index layer 250 may include (e.g., be) an organic material.

In an embodiment, a refractive index of the high refractive index layer 250 may be a substantially the same as or similar to a refractive index of the color filter layer. For example, the refractive index of the high refractive index layer 250 and the refractive index of the color filter layer may each be from about 1.4 to about 1.6.

The high refractive index layer 250 may have at least one convex portion 256. The convex portion 256 may protrude toward the second base substrate 210. For example, the convex portion 256 may have a lens shape that is convex toward the second base substrate 210. In some embodiments, a shape of the convex portion 256 may be at least a portion of an ellipsoid.

In an embodiment, as shown in FIG. 4, the high refractive index layer 250 may have a shape of a mono lens in which one convex portion 256 is formed in one light emitting area. In another example embodiment, as shown in FIG. 5, the high refractive index layer 250 may have a shape of a multi lens in which a plurality of convex portions 256 are formed in one light emitting area.

As shown in FIGS. 4 and 6, the transmitted light emitted from the color conversion layer (or scattered from the conversion layer) may be refractive (e.g., may be refracted) toward a first direction DR1 by the convex portion 256 of the high refractive index layer 250. The first direction DR1 may be normal (e.g., perpendicular) to a surface of the second base substrate 210. For example, the first direction DR1 may be a thickness direction of the display device 10, for example, a direction from the first base substrate 110 toward the second base substrate 210. In some embodiments, the first transmitted light L2R that is emitted from the first color conversion layer 222 may be emitted to the outside through the first color filter layer 242, the high refractive index layer 250, the low refractive index layer 260, and the second base substrate 210. When the first transmitted light L2R is incident from the high refractive index layer 250 to the low refractive index layer 260 (e.g., when the first transmitted light L2R is incident on the low refractive index layer 260 from the high refractive index layer 250 at the convex portions 256 of the high refractive index layer 250), a light path of the first transmitted light L2R may be refracted toward the first direction DR1 by the convex portions 256 of the high refractive index layer 250. Accordingly, when the first transmitted light L2R is emitted to the outside through the second base substrate 210, the convex portion 256 may minimize or reduce absorption of the first transmitted light L2R by the light blocking members 270 that are disposed inside the low refractive index layer 260.

The low refractive index layer 260 may be disposed between the second base substrate 210 and the high refractive index layer 250. In some embodiments, the low refractive index layer 260 may include (e.g., be) an organic material.

In an embodiment, a refractive index of the low refractive index layer 260 may be smaller than each of a refractive index of the second base substrate 210 and the refractive index of the high refractive index layer 250. For example, the refractive index of the second base substrate 210 and the refractive index of the high refractive index layer 250 may each be from about 1.4 to about 1.6, and the refractive index of the low refractive index layer 260 may be from about 1.1 to about 1.4.

The low refractive index layer 260 may contact (e.g., physically and/or directly contact) the high refractive index layer 250. For example, the low refractive index layer 260 may be on (e.g., directly on) the high refractive index layer 250. Accordingly, the low refractive index layer 260 may have at least one concave portion that is corresponding to the convex portion 256 of the high refractive index layer 250.

As shown in FIGS. 3 to 7, the plurality of light blocking members 270 may be disposed inside the low refractive index layer 260. The plurality of light blocking members 270 may be spaced apart (e.g., spaced apart in the plan view) from each other. For example, each of the plurality of light blocking members 270 may include an upper surface 271 and a side surface 272, which may be normal or perpendicular to the upper surface 271. However, the present disclosure is not limited thereto. For example, in some embodiments, the side surface 272 may be slanted or angled such that it extends in part along the first direction DR1 and in part along the second direction DR2. In an embodiment, the upper surface 271 of each of the plurality of light blocking members 270 may contact a lower surface of the second base substrate 210. In addition, the plurality of light blocking members 270 may be disposed to be spaced apart from the high refractive index layer 250. In some embodiments, the low refractive index layer 260 may cover the light blocking members 270. For example, the upper surface 271 of the light blocking members 270 may contact (e.g., physically and/or directly contact) the second base substrate 210 (e.g., a bottom surface of the second base substrate 210) and the low refractive index layer 260 may cover both the side surface 272 and a lower surface of the light blocking members 270.

In an embodiment, each of the plurality of light blocking members 270 may include (e.g., be) an organic material and a light blocking material. For example, each of the plurality of light blocking members 270 may include (e.g., be) the organic material such as an epoxy resin, a phenolic resin, an acrylic resin, and/or a silicone resin, and the light blocking material such as a pigment, dye, and/or carbon black. For example, each of the plurality of light blocking members 270 may have a black color. Accordingly, the plurality of light blocking members 270 may absorb an external light L3 that is incident into the low refractive index layer 260 through the second base substrate 210 from the outside.

In an embodiment, each of the plurality of light blocking members 270 may extend in the first direction DR1. Each of the plurality of light blocking members 270 may have a first length La in the first direction DR1 and a second length Lb in a second direction DR2. The first direction DR1 may be normal (e.g., perpendicular) to a surface of the second base substrate 210. The second direction DR2 may be parallel (e.g., substantially parallel) to the surface of the second base substrate 210. For example, the second direction DR2 may be perpendicular to the first direction DR1. The first length La may be greater than the second length Lb. Accordingly, the external light L3 that is incident into the low refractive index layer 260 through the second base substrate 210 from the outside may be absorbed by the side surface 272 of each of the plurality of light blocking members 270.

In an embodiment, as shown in FIG. 3, the plurality of light blocking members 270 may be disposed entirely in the pixel area PA including the first to third light emitting areas LA1, LA2, and LA3. For example, at least one light blocking member 270 may overlap each of the first to third light emitting areas LA1, LA2, and LA3. For example, at least one light blocking member 270 may overlap each of the first color conversion layer 222, the second color conversion layer 224, and the transmission layer 226. Accordingly, a sub light blocking area (e.g., sub light blocking planar area) may be formed inside each of the first to third light emitting areas LA1, LA2, and LA3. An area of the sub light blocking area that is formed inside each of the first to third light emitting areas LA1, LA2, and LA3 may be determined according to the number, and the second length Lb, of the light blocking members 270 that overlaps each of the first to third light emitting areas LA1, LA2 and LA3.

In an embodiment, the plurality of light blocking members 270 may be disposed to be spaced apart from each other in the second direction DR2. For example, as shown in FIG. 7, the plurality of light blocking members 270 may be spaced apart by a separation distance Lc in the second direction DR2. As a ratio of the first length La to the separation distance Lc increases, the number of the light blocking members 270 overlapping each of the first to third light emitting areas LA1, LA2, and LA3 may increase. In some embodiments, as the separation distance Lc decreases, the number of the light blocking members 270 overlapping each of the first to third light emitting areas LA1, LA2, and LA3 may increase. Accordingly, the area of the sub light blocking area that is formed inside each of the first to third light emitting areas LA1, LA2, and LA3 may be increased. Accordingly, the transmitted light emitted to an outside of the color conversion panel 200 may be reduced. As the ratio of the first length La to the separation distance Lc decreases, the external light L3 absorbed by the plurality of light blocking members 270 may be reduced. In some embodiments, as the separation distance Lc increases, the number of the light blocking members 270 overlapping each of the first to third light emitting areas LA1, LA2, and LA3 may decrease, and the amount of external light L3 absorbed by the plurality of light blocking members 270 may decrease.

In an embodiment, the separation distance Lc may be greater than the first length La. In other words, the ratio of the first length La to the separation distance Lc may be smaller than 1. Because the refractive index of the low refractive index layer 260 is smaller than the refractive index of the second base substrate 210, the external light L3 that is incident into the low refractive index layer 260 from the second base substrate 210 may be refracted toward the second base substrate 210 (e.g., may be refracted away from a direction normal to a portion of a bottom surface of the second base substrate 210 facing the low refractive index layer 260 at which the external light L3 is incident into the low refractive index layer 260 from the second base substrate 210). For example, an incident angle θa may be smaller than a refraction angle θb. Accordingly, the ratio of the first length La to the separation distance Lc may be formed to be less than 1. For example, the first length La and the separation distance Lc may be set such that the ratio of the first length La to the separation distance Lc is less than 1. In some embodiments, by forming the large separation distance Lc between the plurality of light blocking members 270, the area of the sub light blocking area that is formed inside each of the first to third light emitting areas LA1, LA2, and LA3 may be reduced. However, embodiments are not limited thereto. The separation distance Lc may be smaller than or equal to the first length La according to embodiments.

FIGS. 8 to 12 are cross-sectional views illustrating a method of manufacturing a color conversion panel included in the display device of FIG. 1. In the manufacturing method of the color conversion panel 200 described with reference to FIGS. 8 to 12, more detailed descriptions of components which are substantially the same as or similar to components of the color conversion panel 200 described with reference to FIGS. 3 to 7 may not be provided.

Figure 8:
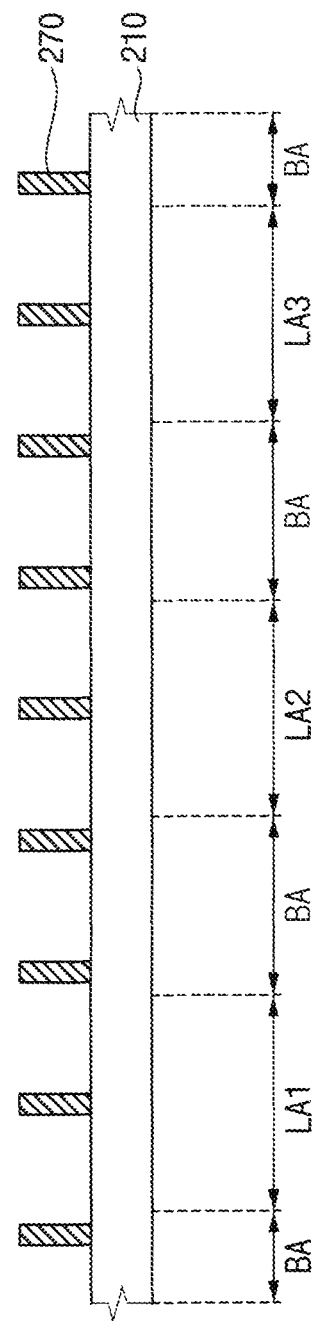
FIGS. 8-12 are cross-sectional views illustrating a method of manufacturing a color conversion panel included in the display device of FIG. 1.

Referring to FIG. 8, the plurality of light blocking members 270 may be formed on the second base substrate 210. For example, each of the plurality of light blocking members 270 may be formed to extend in the first direction DR1 that is normal (e.g., perpendicular) to a surface of the second base substrate 210. The plurality of light blocking members 270 may be formed to be spaced apart from each other by the separation distance Lc in the second direction DR2 that is perpendicular to the first direction DR1.

The plurality of light blocking members 270 may be formed in various suitable ways. For example, an organic layer including (e.g., being) a light blocking material may be formed on the second base substrate 210. The plurality of light blocking members 270 may be formed by patterning the organic layer by a photolithography process and/or the like.

Figure 9:
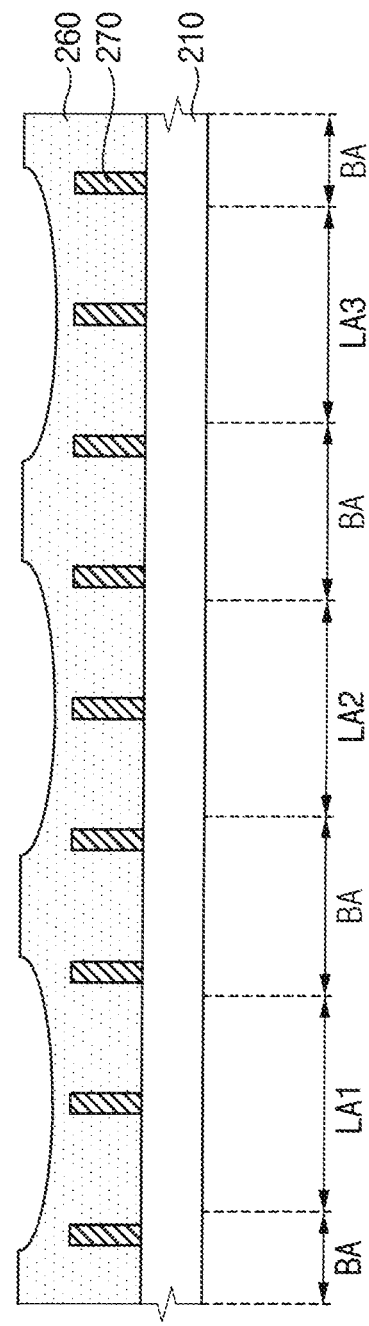

Referring to FIG. 9, the low refractive index layer 260 may be formed on the second base substrate 210. The low refractive index layer 260 may be formed to cover the plurality of light blocking members 270. In an embodiment, the low refractive index layer 260 may have at least one concave portion that is recessed toward the second base substrate 210. For example, the low refractive index layer 260 may be formed to include the concave portion, which may have a lens shape that is concave toward the second base substrate 210.

Figure 10:
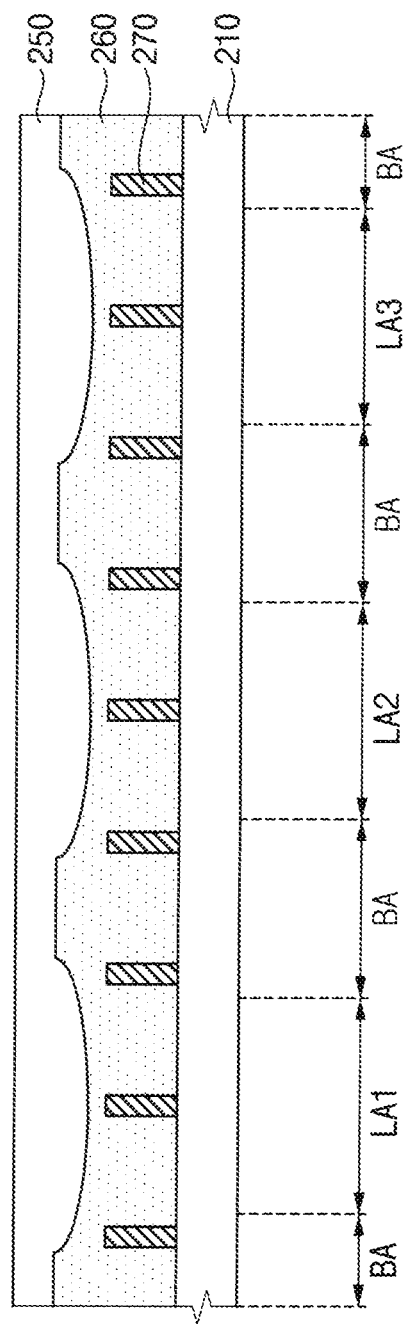

Referring to FIG. 10, the high refractive index layer 250 may be formed on the low refractive index layer 260. The high refractive index layer 250 may be formed to include the convex portion 256 corresponding to the concave portion of the low refractive index layer 260.

Figure 11:
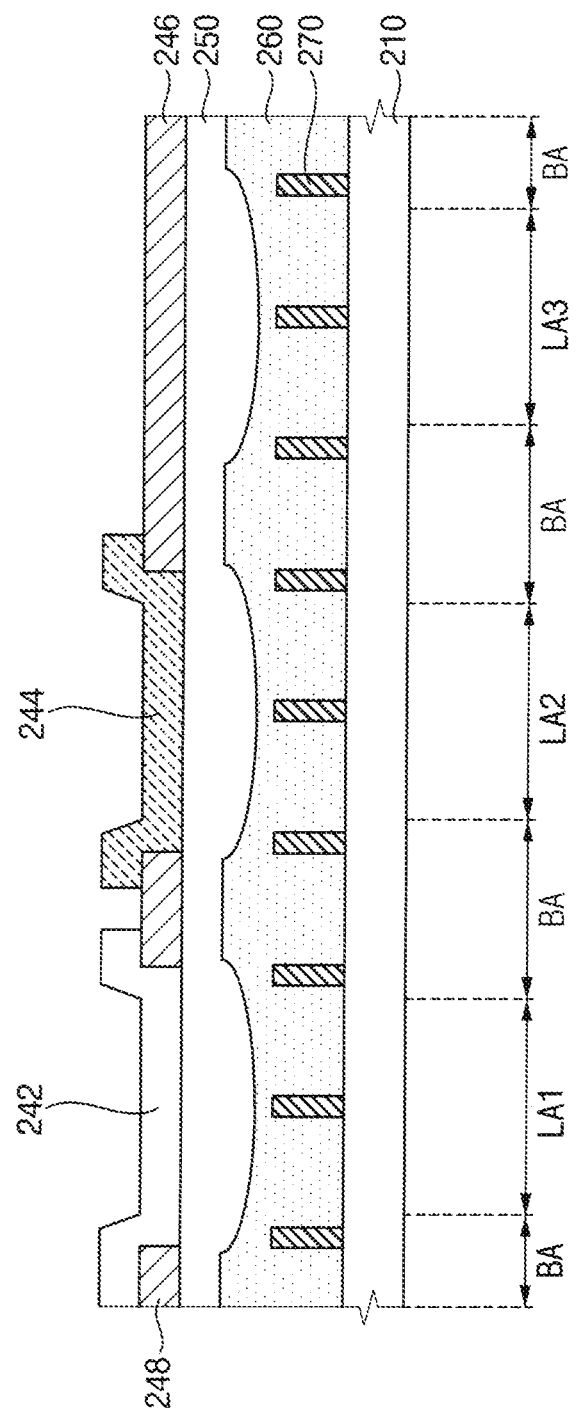

Referring to FIG. 11, the third color filter layer 246 and the light blocking layer 248 may be formed on the high refractive index layer 250. The third color filter layer 246 may be formed to overlap the third light emitting area LA3. The light blocking layer 248 may be formed to overlap the light blocking area BA. In an embodiment, the third color filter layer 246 and the light blocking layer 248 may be formed substantially simultaneously or concurrently. For example, the third color filter layer 246 and the light blocking layer 248 may be formed from the same layer. For example, the third color filter layer 246 and the light blocking layer 248 may be formed by providing a layer of a suitable material on the high refractive index layer 250 and patterning the layer to form openings in the layer corresponding to the first light emitting area LA1 and the second light emitting area LA2.

The first color filter layer 242 and the second color filter layer 244 may be formed. The first color filter layer 242 may be formed to overlap the first light emitting area LA1. The second color filter layer 244 may be formed to overlap the second light emitting area LA2. In some embodiments, a portion of each of the first color filter layer 242 and the second color filter layer 244 may cover a part (e.g., an edge) of the light blocking layer 248.

Figure 12:
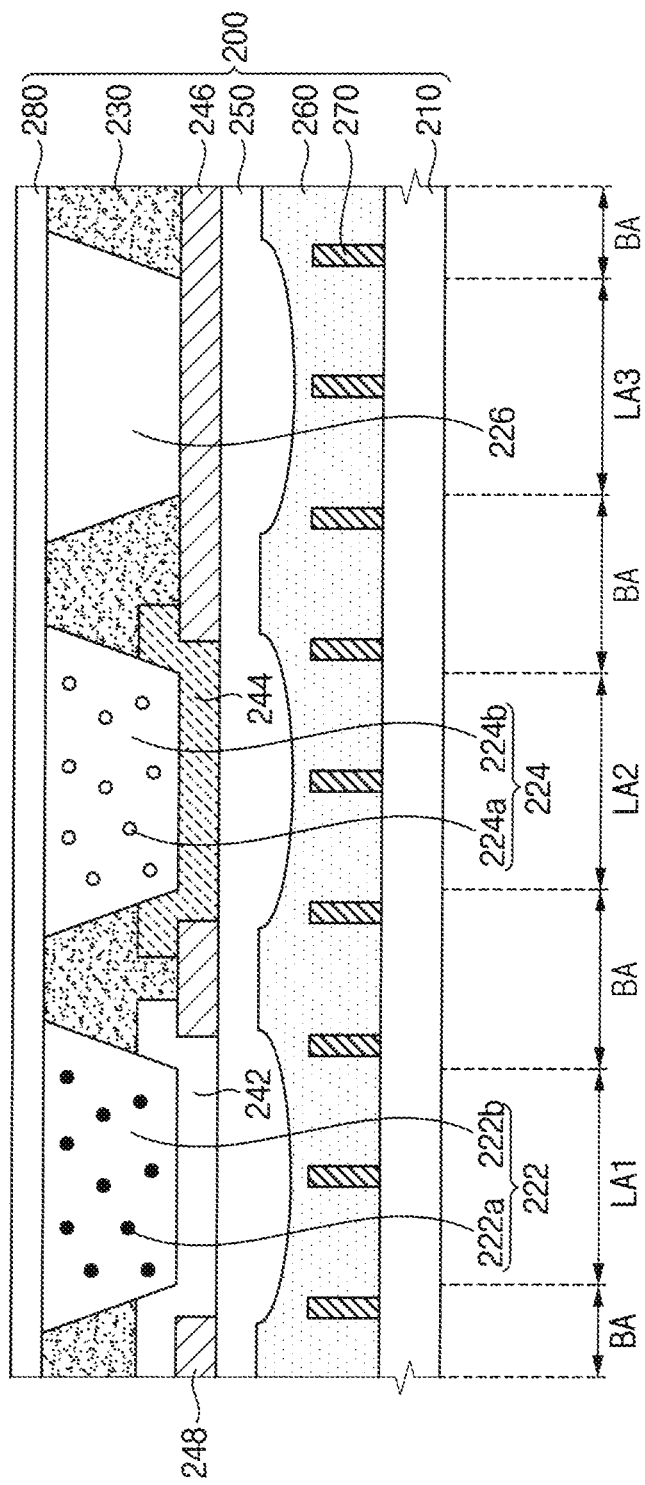

Referring to FIG. 12, the partition wall 230 may be formed on the color filter layer. The partition wall 230 may overlap the light blocking area BA that is positioned between the first to third light emitting areas LA1, LA2 and LA3. For example, the partition wall 230 may have a plurality of openings overlapping each of the first to third light emitting areas LA1, LA2, and LA3.

The partition wall 230 may be formed in various suitable ways. For example, an organic layer including (e.g., being) a light blocking material may be formed on the color filter layer. The partition wall 230 may be formed by removing portions corresponding to the plurality of openings (e.g., portions corresponding to the first to third light emitting areas LA1, LA2, and LA3) by patterning the organic layer by the photolithography process and/or the like.

The first color conversion layer 222, the second color conversion layer 224, and the transmission layer 226 may be formed on the color filter layer. The first color conversion layer 222 may be formed on the first color filter layer 242 and may include the wavelength-converting particles 222a that are to convert the incident light L1B into the first transmitted light L2R. The second color conversion layer 224 may be formed on the second color filter layer 244 and may include the wavelength-converting particles 224a that are to convert the incident light L1B into the second transmitted light L2G. The transmission layer 226 may be formed on the third color filter layer 246.

For example, the first color conversion layer 222, the second color conversion layer 224, and the transmission layer 226 may be formed by providing an ink including (e.g., being) the corresponding composition inside the plurality of openings of the partition wall 230. Accordingly, the openings may be filled with the corresponding composition. The compositions in the openings may be cured to form the first color conversion layer 222, the second color conversion layer 224, and the transmission layer 226. For example, the compositions may be cured by heat and/or light.

The protective layer 280 covering the first color conversion layer 222, the second color conversion layer 224, the transmission layer 226, and the partition wall 230 may be formed. The protective layer 280 may include (e.g., be) an inorganic material. Optionally, the protective layer 280 may be omitted.

Figure 13:
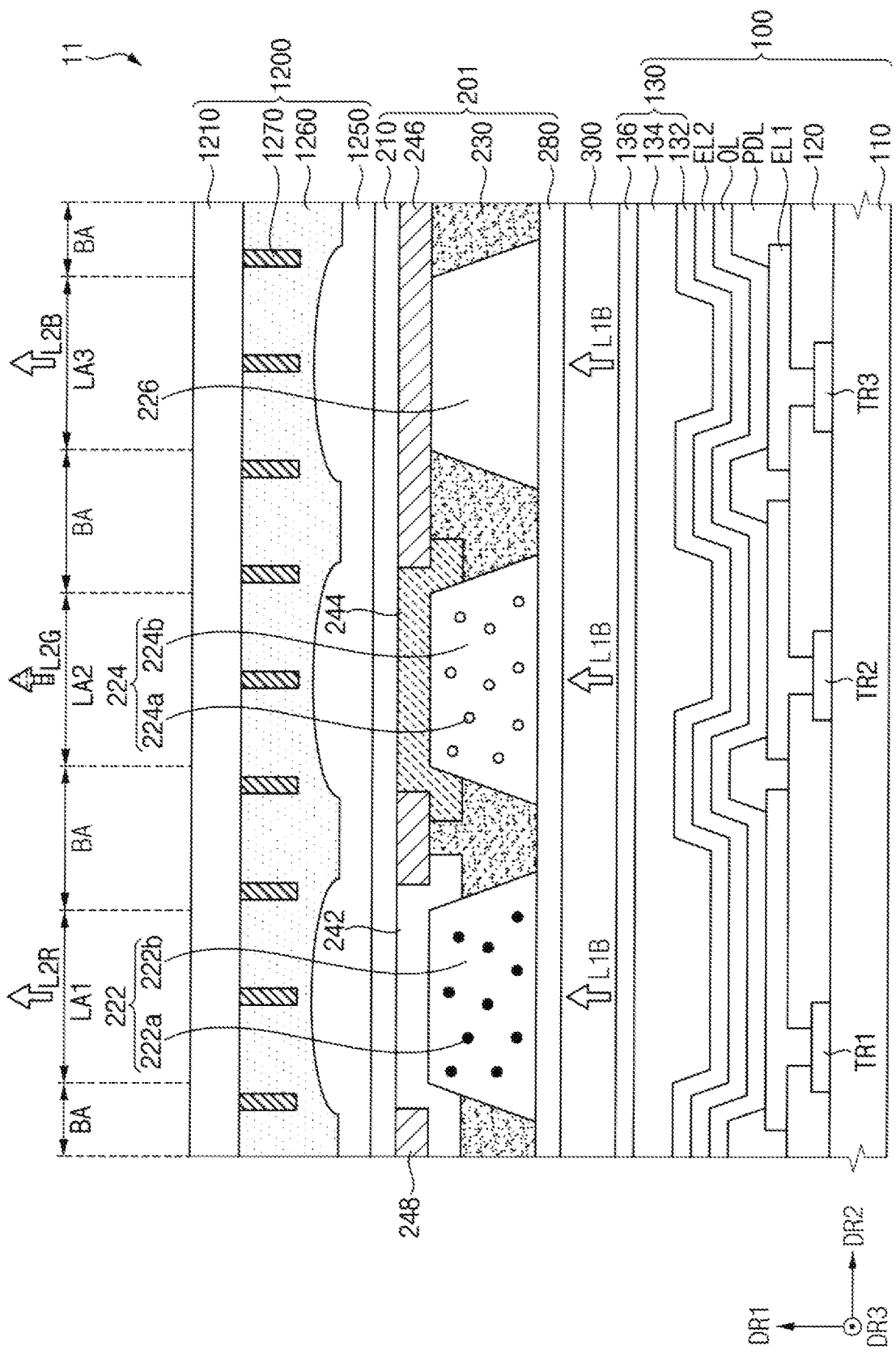
FIG. 13 is a cross-sectional view illustrating a display device according to another embodiment.

FIG. 13 is a cross-sectional view illustrating a display device according to another example embodiment.

Referring to FIG. 13, a display device 11 according to another example embodiment may include the display panel 100, a color conversion panel 201, and a film structure 1200. The film structure 1200 may be disposed on the color conversion panel 201.

The color conversion panel 201 may be substantially the same as or similar to the color conversion panel 200 described with reference to FIGS. 3 to 7 except that the high refractive index layer 250, the low refractive index layer 260, and the plurality of light blocking members 270 are not included.

The film structure 1200 may include a third base substrate 1210, a low refractive index layer 1260, a plurality of light blocking members 1270, and a high refractive index layer 1250. The low refractive index layer 1260 may be disposed under the third base substrate 1210. In some embodiments, the third base substrate 1210 may include a Tri-Acetyl Cellulose (TAC) film. The plurality of light blocking members 1270 may be disposed inside the low refractive index layer 1260. The plurality of light blocking members 1270 may be spaced apart (e.g., spaced apart in the plan view) from each other. The high refractive index layer 1250 may be disposed under the low refractive index layer 1260.

Each of the low refractive index layer 1260, the plurality of light blocking members 1270, and the high refractive index layer 1250 included in the film structure 1200 may respectively be substantially the same as or similar to (e.g., substantially the same or similar composition, structure, and/or arrangement as) the low refractive index layer 260, the plurality of light blocking members 270, and the high refractive index layer 250 included in the display device 10 that is described with reference to FIGS. 3 to 7.

Although certain example embodiments and implementations have been described herein, other example embodiments and modifications will be apparent from this description. Accordingly, the present disclosure is not limited to the example embodiments described herein, but rather to the broader scope of the appended claims, equivalents thereof, and various obvious and suitable modifications and equivalent arrangements as would be apparent to a person of ordinary skill in the art.

What is claimed is:

1. A color conversion panel comprising: a base substrate; a low refractive index layer under the base substrate; a plurality of light blocking members spaced apart from each other in the low refractive index layer and extending in a first direction normal to a surface of the base substrate; a high refractive index layer under the low refractive index layer and comprising at least one convex portion, wherein the convex portion protrudes toward the base substrate; a color filter layer under the high refractive index layer; and a color conversion layer under the color filter layer that converts an incident light into a transmitted light, wherein the transmitted light has a second color different from a first color of the incident light, wherein the color filter layer is between the high refractive index layer and the color conversion layer along the first direction, and wherein each of the plurality of the light blocking members is to absorb at least a portion of an external light incident from an outside into the low refractive index layer through the base substrate at a side surface of the light blocking member.

2. The color conversion panel of claim 1, wherein the plurality of the light blocking members are spaced apart in a second direction perpendicular to the first direction.

3. The color conversion panel of claim 2, wherein a separation distance between adjacent light blocking members of the plurality of the light blocking members is greater than a length of each of the adjacent light blocking members in the first direction.

4. The color conversion panel of claim 1, wherein each of the plurality of the light blocking members has a black color.

5. The color conversion panel of claim 1, wherein the color conversion layer overlaps at least one of the plurality of the light blocking members.

6. The color conversion panel of claim 1, wherein a refractive index of the low refractive index layer is smaller than each of a refractive index of the base substrate and a refractive index of the high refractive index layer.

7. The color conversion panel of claim 1, wherein a refractive index of the high refractive index layer is the same as a refractive index of the color filter layer.

8. A display device comprising: a display panel comprising an array of pixels; and a color conversion panel on the display panel, wherein the color conversion panel comprises: a base substrate; a low refractive index layer under the base substrate; a plurality of light blocking members spaced apart from each other in the low refractive index layer and extending in a first direction normal to a surface of the base substrate; a high refractive index layer under the low refractive index layer and comprising at least one convex portion, wherein the convex portion protrudes toward the base substrate; a color filter layer under the high refractive index layer; and a color conversion layer under the color filter layer that converts an incident light incident from the display panel into a transmitted light, wherein the transmitted light has a second color different from a first color of the incident light, and wherein each of the plurality of the light blocking members is to absorb at least a portion of an external light incident from an outside into the low refractive index layer through the base substrate at a side surface of the light blocking member.

9. The display device of claim 8, wherein the plurality of the light blocking members are spaced apart in a second direction perpendicular to the first direction.

10. The display device of claim 9, wherein a separation distance between adjacent light blocking members of the plurality of the light blocking members is greater than a length of each of the adjacent light blocking members in the first direction.

11. The display device of claim 8, wherein each of the plurality of the light blocking members has a black color.

12. The display device of claim 8, wherein the color conversion layer overlaps at least one of the plurality of the light blocking members.

13. The display device of claim 8, wherein a refractive index of the low refractive index layer is smaller than each of a refractive index of the base substrate and a refractive index of the high refractive index layer.

14. The display device of claim 8, wherein a refractive index of the high refractive index layer is the same as a refractive index of the color filter layer.

15. A display device comprising: a display panel comprising an array of pixels; a color conversion panel on the display panel; and a film structure on the color conversion panel, wherein the color conversion panel comprises: a first base substrate; a color filter layer under the first base substrate; and a color conversion layer under the color filter layer that converts an incident light incident from the display panel into a transmitted light, wherein the transmitted light has a second color different from a first color of the incident light, wherein the film structure comprises: a second base substrate; a low refractive index layer under the second base substrate; a plurality of light blocking members spaced apart from each other in the low refractive index layer and extending in a first direction normal to a surface of the second base substrate; and a high refractive index layer under the low refractive index layer and comprising at least one convex portion, wherein the convex portion protrudes toward the second base substrate, and wherein each of the plurality of light blocking members is to absorb at least a portion of an external light incident from an outside into the low refractive index layer through the second base substrate at a side surface of the light blocking member.

16. The display device of claim 15, wherein the plurality of the light blocking members are spaced apart in a second direction perpendicular to the first direction.

17. The display device of claim 16, wherein a separation distance between adjacent light blocking members of the plurality of the light blocking members is greater than a length of each of the adjacent light blocking members in the first direction.

18. The display device of claim 15, wherein each of the plurality of the light blocking members has a black color.

19. The display device of claim 15, wherein the color conversion layer overlaps at least one of the plurality of the light blocking members.

20. The display device of claim 15, wherein a refractive index of the low refractive index layer is smaller than each of a refractive index of the second base substrate and a refractive index of the high refractive index layer.

* * * * *